United States Patent [19]

Taylor et al.

[11] Patent Number: 5,182,467
[45] Date of Patent: Jan. 26, 1993

[54] HIGH PERFORMANCE MULTIPLEXER FOR IMPROVING BIT ERROR RATE

[75] Inventors: Stewart S. Taylor, Beaverton; Gary D. McCormack, Aloha; William H. Davenport, Hillsboro; Patrick J. Hamilton, Aloha, all of Oreg.

[73] Assignee: TriQuint Semiconductor, Inc., Beaverton, Oreg.

[21] Appl. No.: 748,461

[22] Filed: Aug. 22, 1991

[51] Int. Cl.⁵ .................... H03K 17/56; H03K 17/00
[52] U.S. Cl. .................... 307/243; 307/529; 328/104; 370/112
[58] Field of Search .......... 307/243, 529, 265; 328/104, 154, 164; 370/112

[56] References Cited

U.S. PATENT DOCUMENTS

| | | | |
|---|---|---|---|
| 3,721,959 | 3/1973 | George | 307/360 |
| 4,835,771 | 5/1989 | Moussie | 307/243 |
| 4,939,729 | 7/1990 | Weisser | 370/112 |
| 4,970,410 | 11/1990 | Matsushita | 307/243 |

Primary Examiner—William L. Sikes
Assistant Examiner—Toan Tran
Attorney, Agent, or Firm—Skjerven, Morrill, MacPherson, Franklin & Friel

[57] ABSTRACT

An apparatus and method for improving the bit error rate of multiplexed signals in a multiplexer system includes independently controlling two types of timing errors. The first type of timing error is related to the timing of transitions between alternating portions of the multiplexed output signal. The second type of timing error is related to the amplitude of the crossing points of the multiplexed signal portions. Varying the duty cycle of the clock signal to the multiplexer controls the transition between the alternating portions of the multiplexed output signal, and adding a voltage offset between single-ended components of the multiplexed output signal controls the amplitude of the crossing points between the one/zero and zero/one transitions of the multiplexed outut signal. The two types of timing errors are controlled with two separate control voltage ports that are independently and continuously variable in order to achieve the optimum bit error rate.

23 Claims, 6 Drawing Sheets

HIGH PERFORMANCE MULTIPLEXER FOR IMPROVING BIT ERROR RATE

BACKGROUND OF THE INVENTION

This invention pertains to multiplexers, and more particularly to a high-speed multiplexer having independent "one/zero" and "odd/even" adjustments for minimizing the bit error rate of a multiplexed signal.

Any digital signal, such as a data transmission output signal, is comprised of many transitions between a logic zero level and a logic one level over time. In characterizing the error rate of a data transmission system, multiple output signal waveforms responsive to multiple input conditions are overlayed. The overlayed output signal waveforms comprise the well known "eye pattern." The various transitions from the logic zero level to the logic one level and from the logic one level to the logic zero level in the eye pattern intersect at crossing points. The crossing points of the overlayed waveform can be characterized in both time and amplitude. The time and amplitude information of the crossing points in the eye pattern is highly correlated with the overall data transmission system bit error rate. In a system having low error, the crossing points are spaced at equal intervals in time (50% duty cycle), and the crossing points occur halfway between the logic zero level and the logic one level in amplitude.

Similarly, for a multiplexed digital signal, comprising sequential components of two or more distinct digital signals, it is important that the error introduced by the multiplexer itself be characterized and, if possible, reduced or eliminated.

Figure 1:
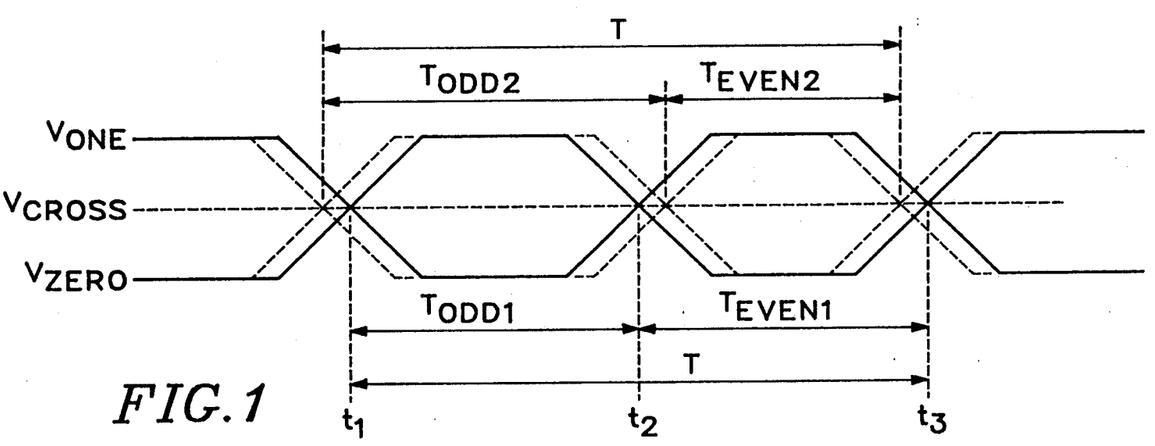
FIG. 1 is a composite multiplexer output signal used to characterize the performance of the multiplexer with respect to transition times.

Referring now to FIG. 1, the performance of a two-to-one multiplexer is characterized in time by displaying a composite output waveform. The output waveform is comprised of first and second input signals, each alternatively selected during sequential time intervals $T_{ODD}$ and $T_{EVEN}$. The transition from selecting the first input signal to the second input signal is controlled by the multiplexer and the circuit that causes the multiplexer to switch. In an ideal multiplexer output signal, each of the first and second input signals is alternatively selected during sequential time intervals. Transitions from a logic zero to a logic one and transitions from a logic one to a logic zero for both time intervals are shown to display three crossing points. Horizontal lines indicating transitions between a logic zero and a logic zero, and transitions between a logic one and a logic one, which normally complete the eye pattern, are not shown for clarity. An ideal multiplexer output waveform is shown in solid lines, and a non-ideal, odd/even time skewed multiplexer output waveform is shown in dashed lines. In the ideal waveform, the times between consecutive crossing points, $T_{ODD1}$ and $T_{EVEN1}$, are equal. The total of $T_{ODD1}$ and $T_{EVEN1}$ defines a total time equal to T. In the non-ideal waveform, the times between consecutive crossing points, $T_{ODD2}$ and $T_{EVEN2}$, are not equal although the total of $T_{ODD2}$ and $T_{EVEN2}$ is still equal to T.

Figure 2:
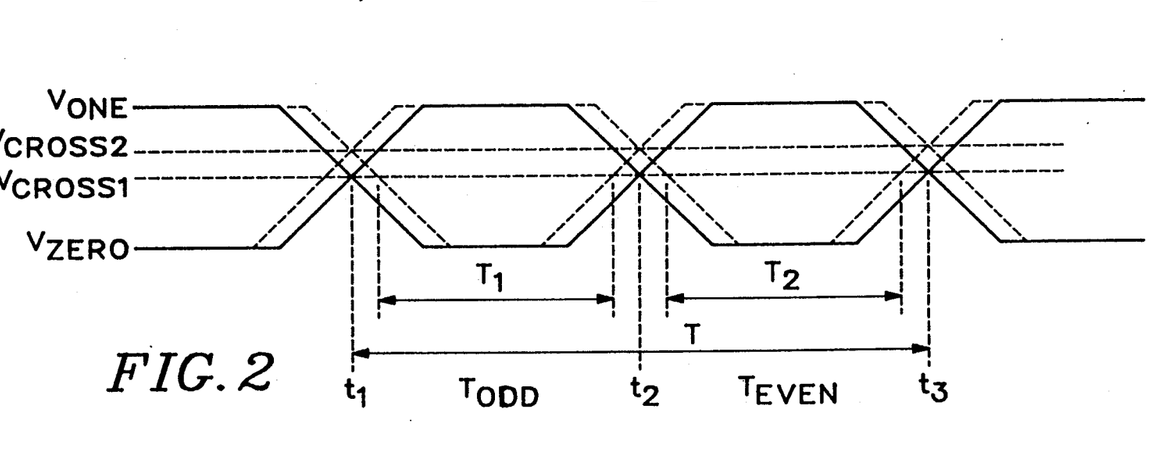
FIG. 2 is a composite multiplexer output signal used to characterize the performance of the multiplexer with respect to the amplitude of the crossing points.

Referring now to FIG. 2, the performance of a two-to-one multiplexer is further characterized in time by the amplitude of the crossing points displayed in the composite output waveform. The ideal multiplexer output waveform is again shown in solid lines, and the non-ideal, one/zero time skewed multiplexer output waveform is shown in dashed lines. In the ideal waveform, the consecutive crossing points occur at the threshold voltage $V_{CROSS1}$, which is halfway between the logic zero level, $V_{ZERO}$, and the logic one level, $V_{ONE}$. In the non-ideal waveform, the consecutive crossing points occur at a threshold voltage $V_{CROSS2}$, which is either more positive or more negative than halfway between the logic zero level and the logic one level.

In either the ideal case or the non-ideal case shown in FIG. 2, the total time interval for one cycle of the multiplexed output waveform is still equal to T ($T_{ODD}$ plus $T_{EVEN}$) from crossing point $t_1$ to crossing point $t_3$. However, at the threshold voltage $V_{CROSS1}$, the non-ideal waveform still has equal time intervals $T_{ODD}$ and $T_{EVEN}$, but these time intervals are each less than 50% of the total cycle to complete the multiplexing of the two input signals. This timing error is significant for logic blocks coupled to the output of the multiplexer, which will trigger at the $V_{CROSS1}$ threshold voltage and not the $V_{CROSS2}$ threshold voltage.

Both the odd/even and one/zero timing errors shown in FIGS. 1 and 2 can be caused by offset voltage, rise and fall time mismatches, as well as other random device mismatches.

It is important to note that the performance of the multiplexer is degraded in time both by clock skew timing (odd/even) errors associated with the switching of the multiplexer and by crossing point amplitude timing (one/zero) errors occurring at the output of the multiplexer and affecting circuits coupled to the output. Each of these timing error components are independent, and each contributes to closing the eye pattern and increasing the bit error rate. The errors can be generated in the clock signal, in the multiplexer itself, in the output stage, and in subsequent circuits coupled to the output of the multiplexer.

Therefore, what is desired is a multiplexer that has independent odd/even and one/zero adjustments for cancelling out both clock skew and crossing point timing errors in order to minimize the bit error rate of the multiplexed output signal.

SUMMARY OF THE INVENTION

It is therefore a principal object of the present invention to provide a multiplexer having independent odd/even and one/zero adjustments to minimize the bit error rate.

It is another object of the present invention to correct for errors in multiplexer systems caused by the multiplexer itself, the system clock signal, or the system output stages.

According to the present invention, a method for improving the bit error rate of multiplexed signals in a multiplexer system includes independently controlling timing errors in the multiplexed output signal associated with the transitions between the first and second input signals and in the amplitude of the crossing points. Varying the duty cycle of the clock signal to the multiplexer controls the transition between the alternating portions of the multiplexed output signal with respect to time, and adding a voltage offset between single-ended components of the multiplexed output signal controls the amplitude of crossing points between one/zero and zero/one transitions of the multiplexed output signal. The multiplexed output signal is controlled with two separate control voltage ports that are independently and continuously variable in order to achieve the optimum bit error rate.

In a preferred embodiment, the improved multiplexer system includes an $2^N$-to-two low-speed multiplexer having N input channels in series with a two-to-one high-speed multiplexer for providing a high-speed differential multiplexed output signal. The two-to-one multiplexer includes two differential input channels, a differential clock input, and a differential output. The duty cycle of the clock signal to the two-to-one multiplexer is supplied by a divide-by-two circuit in series with a duty cycle adjustment buffer amplifier. The divide-by-two circuit provides a relatively stable 50% duty cycle clock signal from a system clock. The duty cycle adjustment buffer amplifier adds an offset voltage between the single-ended components of the clock signal from the divider block, thus changing the duty cycle to compensate for transition time-related system errors. Similarly, a crossing point amplitude adjustment buffer adds an offset voltage between the single-ended components of the differential multiplexer output signal, thus changing the amplitude of the crossing points to compensate for crossing point-related timing errors. An output stage buffers and normalizes the logic levels of the error-corrected multiplexed output signal.

The foregoing and other objects, features and advantages of the present invention are more readily apparent from the following detailed description of a preferred embodiment that proceeds with reference to the drawings.

DETAILED DESCRIPTION

Figure 3:
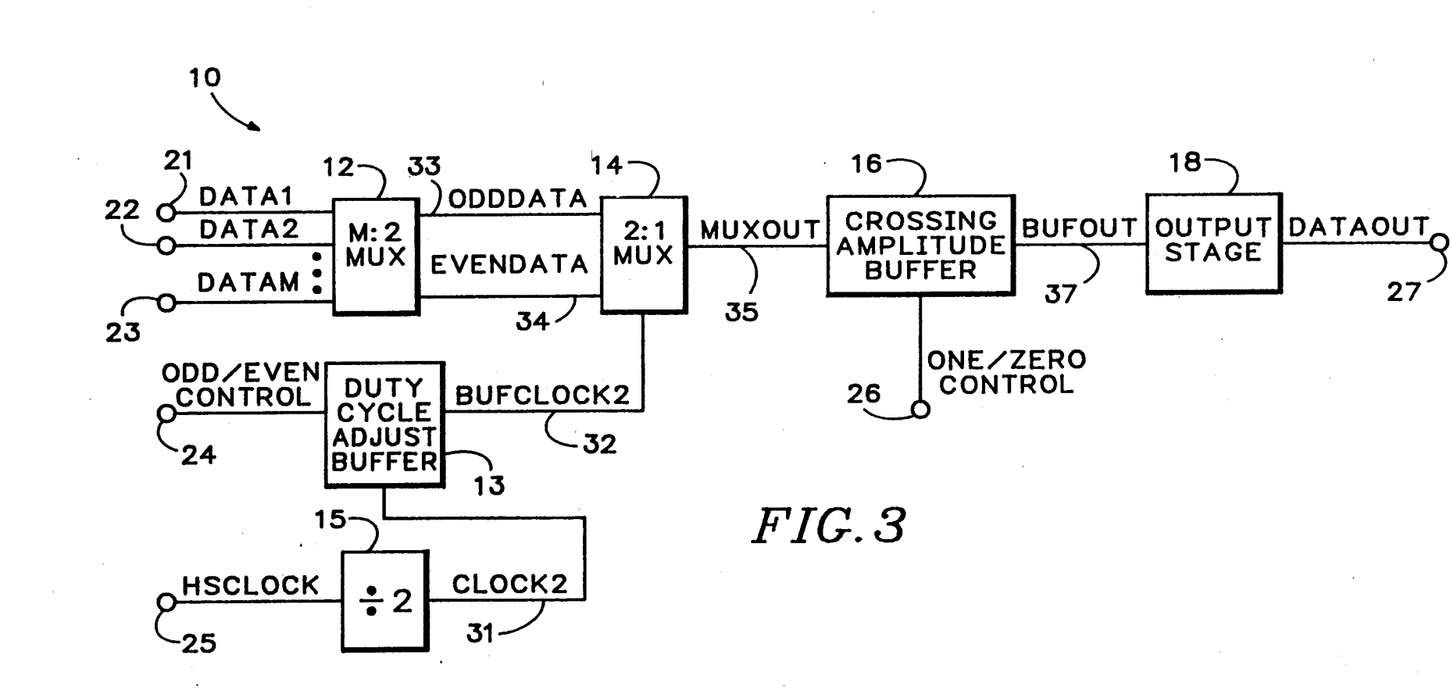
FIG. 3 is a block diagram of an improved, high performance multiplexer having independent odd/even and one/zero adjustments according to the present invention.

A block diagram of an improved, error-corrected multiplexer system 10 is shown in FIG. 3. The multiplexer system 10 multiplexes $2^N$ input signals (N is an integer greater than one) into one single multiplexed output signal for the purpose of high-speed data transmission. A $2^N$-to-two low-speed multiplexer 12 has $2^N$ input channels DATA1, DATA2, through DATAM ($M=2^N$) for receiving the $2^N$ input signals on circuit nodes 21 through 23. Each input signal is a relatively low-speed differential signal. The maximum frequency of each input signal is equal to the maximum frequency of the final multiplexed output signal divided by $2^N$. The two outputs of the $2^N$-to-two multiplexer 12 are labeled ODDDATA on conductor 33 and EVEN-DATA on conductor 34. The $2^N$-to-two multiplexer 12 operates at relatively low-speed, and therefore timing errors are of little consequence. Multiplexer 12 can therefore be of conventional design. In series with multiplexer 12 is a two-to-one high-speed multiplexer 14. The two inputs for multiplexer 14 are connected to the two outputs of multiplexer 12, ODDDATA and EVENDATA on conductors 33 and 34, respectively. The two-to-one multiplexer 14 includes a differential clock input labeled BUFCLOCK2 on conductor 32, and a differential output labeled MUXOUT on conductor 35. The conductors in FIG. 3 can either be a single conductor for carrying a single-ended signal or a pair of conductors for carrying a differential signal.

The description of each of the circuit blocks of the present invention proceeds below with the use of terms "amplifier" and "buffer amplifier." While such terms are normally used in conjunction with amplification in the linear range, they are used here to describe overdriven, limiting amplifiers that form logic switching gates.

The BUFCLOCK2 clock signal is supplied to the two-to-one multiplexer 14 by a divide-by-two circuit 15 in series with a duty cycle adjustment buffer amplifier 13. The divide-by-two circuit 15 provides a relatively stable 50% duty cycle clock signal designated CLOCK2 on conductor 31 from a high-speed system clock designated HSCLOCK at circuit node 25. The divide-by-two circuit 15 is of conventional design to trigger on either the rising or falling edges of each full cycle of HSCLOCK.

The duty cycle adjustment buffer amplifier 13 adds an offset voltage between the single-ended components of the clock signal CLOCK2 from the divider block 15, thus changing the duty cycle to compensate for time-related system errors. Referring back to FIGS. 1-2, the CLOCK2 signal is similar to the voltage waveforms shown in that CLOCK2 is a periodic differential signal having single-ended components having rise and fall times that are a significant portion of each cycle. It is therefore apparent to those skilled in the art that a DC offset voltage added between the single-ended components of the CLOCK2 waveform changes the effective time that one of the single-ended components of the waveform is more positive than the other of the single-ended components of the waveform. Again, this is due to the significant rise and fall times associated with extremely high-speed signals, such as signals having a frequency in excess of one gigahertz. Consequently, the effective duty cycle for subsequent circuit blocks receiving the differential clock signal and offset is also changed. Further, continuously varying the DC offset voltage between a negative value and a positive value continuously varies the duty cycle between a ratio less than 50% to a ratio greater than 50%. The DC offset voltage is continuously added to the BUFCLOCK2 differential signal by the ODD/EVEN CONTROL voltage at circuit node 24. The ODD/EVEN CONTROL is a single-ended or differential voltage that can be conveniently scaled to control the proper range of duty cycle ratios.

Since the duty cycle of BUFCLOCK2 can be controlled between a ratio less than 50% to a ratio greater than 50%, it is apparent that timing errors in the clock cycle blocks 13 and 15 can be corrected. In addition, timing errors in the high-speed multiplexer 14 can also be corrected, since BUFCLOCK2 controls the relative times that multiplexer 14 will pass either ODDDATA or EVENDATA to the output. By choosing the proper control voltage, the final duty cycle of the output waveform can be adjusted to the optimum 50% ratio.

Similarly, a crossing point amplitude adjustment buffer 16 adds an offset voltage between the single-ended components of the differential multiplexer output signal MUXOUT, thus changing the voltage crossing points to compensate for crossing point-related timing errors. The amount of DC offset, positive or negative, can be continuously adjusted by means of a control voltage designated ONE/ZERO CONTROL at circuit node 26. The offset multiplexed output signal BUFOUT is provided at the output of buffer 16 on conductor 37.

Referring again back to FIGS. 1–2 for purposes of illustration, the single-ended components of the differential MUXOUT signal have rise and fall times that are a significant portion of each cycle. It is therefore apparent to those skilled in the art that a DC offset voltage added to one or both of the single-ended components of the MUXOUT waveform changes the point on the waveform at which a subsequent circuit block such as a differential pair of transistors will switch. Again, this is due to the significant rise and fall times associated with extremely high-speed signals. Consequently, the effective voltage switching threshold on the BUFOUT signal for subsequent circuit blocks is also changed. Further, continuously varying the DC offset voltage between a negative value and a positive value continuously varies the effective voltage threshold from a voltage less than 50% between the logic zero and logic one levels to a voltage greater than 50% between the logic zero and logic one levels. The ONE/ZERO CONTROL is a single-ended or differential voltage that can be conveniently scaled to control the proper range of voltage crossing thresholds.

In both the odd/even and one/zero adjustments, the mechanism of adding a voltage offset is the same. However, the placement of the offset in either the clock input to the multiplexer 14, or the output multiplexed signal at conductor 35, changes the effect of the offset voltage such that both types of timing errors are independently corrected. Both types of timing errors can be significant and are ideally corrected independently for optimum performance. With only one of these adjustments, both errors cannot be reduced or eliminated.

An output stage 18 buffers and normalizes the logic levels of the error-corrected multiplexed output signal BUFOUT. The output stage 18 contains a differential transistor pair input section that responds to the offset voltage in the BUFOUT signal. The BUFOUT signal is received at the input of output stage 18 on conductor 37. A differential output signal having standard logic levels without any offsets (however, corrected for both types of timing errors) is provided at the output node 27.

The present invention is designed to work with extremely high frequency signals in the gigahertz range having the rise and fall time characteristics previously described. If desired, the multiplexer system 10 of the present invention may be fabricated on a single chip using Gallium Arsenide ("GaAs") technology. Therefore, suitable transistor schematics are shown in FIGS. 4–7 and described below. The $2^N$-to-two multiplexer of FIG. 3 typically operates at lower frequencies, is of conventional design, and therefore is not described in further detail. Similarly, the divide-by-two circuit 15, while operating at the high system clock frequency, can also be of conventional design and is therefore not described in further detail. The following circuits and description does not limit the broader principles of the invention, but is merely one practical and physically realizable embodiment of those principles.

Figure 4:
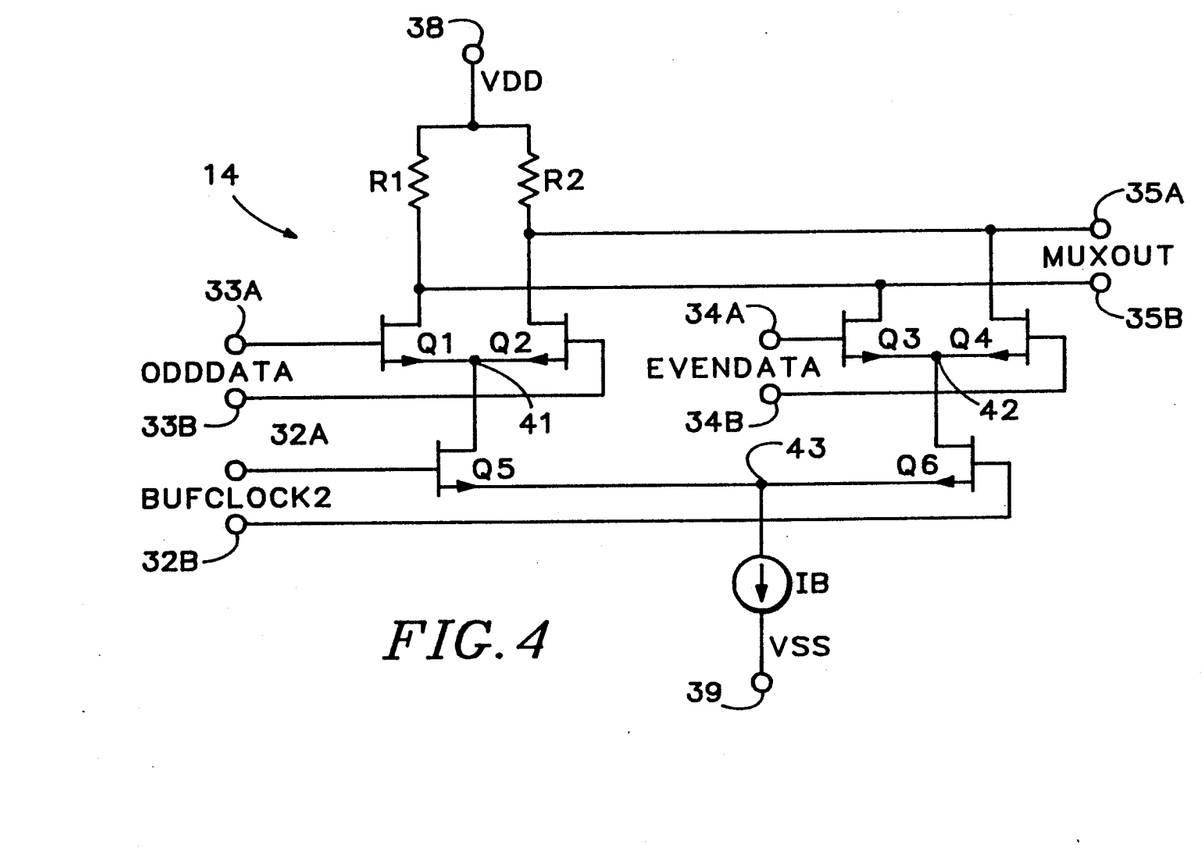
FIG. 4 is a schematic diagram of the two-to-one multiplexer in FIG. 3.

Referring now to FIG. 4, a schematic of the two-to-one multiplexer 14 is shown having FETs Q1–Q6. Each corresponding differential pair of FETs is of the same type. In the preferred embodiment, each pair of FETs employs enhancement FETs that are normally off with $V_{GS}$ equal to zero volts. The two-to-one multiplexer 14 includes load resistors R1 and R2 coupled to the single-ended outputs 35A and 35B. A first differential pair of FETs Q1 and Q2 receives the first data input signal ODDDATA at single-ended inputs 33A and 33B. The output of the first differential pair of FETs is coupled to the load resistors R1 and R2. The coupled sources of FETs Q1 and Q2 form a first bias node 41. A second differential pair of FETs Q3 and Q4 receives the second data input signal EVENDATA at single-ended inputs 34A and 34B. The output of the second differential pair of FETs is also coupled to load resistors R1 and R2. The coupled sources of FETs Q3 and Q4 form a second bias node 42. A third differential pair of FETs Q5 and Q6 receive the time corrected clock signal BUFCLOCK at single-ended inputs 32A and 32B. The drain of FET Q5 is coupled to the first bias node 41, and the drain of FET Q6 is coupled to the second bias node 42. The coupled sources of FETs Q5 and Q6 for a third bias node 43 coupled to bias current source IB. The DC power for the multiplexer 14 is supplied by a positive power supply at node 38 designated VDD, and a negative power supply at node 39 designated VSS. For a typical GaAs process, VDD is equal to zero volts and VSS is typically equal to −5 volts. For a logic swing of 0.8 volts at a switching speed of about 1.25 gigahertz, R1 and R2 are both equal to 670 ohms, and IB is equal to 1.2 milliamps.

In operation, multiplexer 14 selects either the ODDDATA signal or the EVENDATA signal to be passed to the output to form the composite multiplexed signal MUXOUT. When the single-ended components of BUFCLOCK2 at input 32A and 32B are equal, FETs Q5 and Q6 conduct equal amounts of current, equally energizing the first and second differential pairs of FETs. However, when the single-ended component of BUFCLOCK2 at input 32A is more positive than the single-ended component of BUFCLOCK2 at input 32B, FET Q5 begins to conduct more current, and FET Q6 begins to conduct proportionally less current. The total current remains equal to IB. When FET Q5 is fully conducting, the MUXOUT signal is substantially a function of the ODDDATA input signal. Similarly, when the polarity of the BUFCLOCK2 signal switches polarity and attains a sufficient voltage differential, FET Q6 is fully conducting and the MUXOUT signal is substantially a function of the EVENDATA input signal. Note that the differential arrangement of FETs Q5 and Q6 allows the switching action of the multiplexer 14 to be controlled by a DC offset added to either or both of inputs 32A and 32B.

Figure 5:
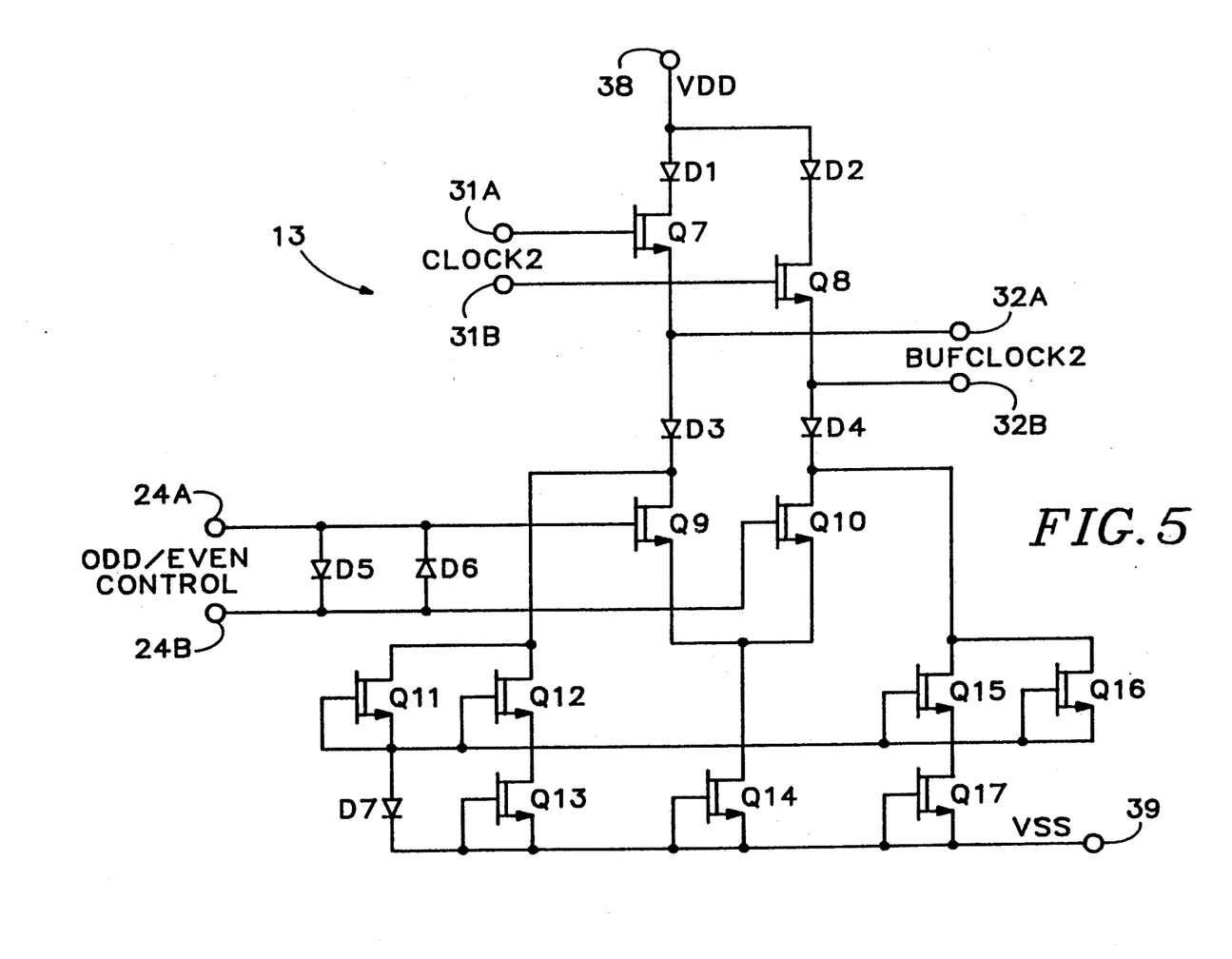
FIG. 5 is a schematic diagram of the duty cycle adjustment buffer of FIG. 3.

Referring now to FIG. 5, the duty cycle adjustment buffer amplifier 13 is shown in schematic form. All FETs in buffer amplifier 13 are of the depletion type that are normally on for $V_{GS}$ of zero volts. The divided system clock signal CLOCK2 is received at single-ended inputs 31A and 31B. The BUFCLOCK2 signal including the offset is provided at single-ended outputs 32A and 32B. The ODD/EVEN CONTROL voltage for adding a variable voltage offset between the first and second single-ended components of CLOCK2 is received at single-ended inputs 24A and 24B. A differential buffer amplifier includes FETs Q7 and Q8. The gates of Q7 and Q8 form the input of the buffer, and the sources of Q7 and Q8 form the output of the buffer. Diodes D1 through D4 equalize drain-to-source voltage VDS across FETs Q7-Q10 for accurate biasing. FETs Q11 through Q17 generate a pair of bias currents for biasing FETs Q7 and Q8. FET Q14 is a current source FET having a coupled gate and source. The drain current of FET Q14 is set to IDSS, which for a device width and length equal to 33 by 1 microns, is approximately 1.5 milliamps. FETs Q12, Q13 and FETs Q15, Q17 each form cascoded current sources. FETs Q13 and Q17 are current-source connected and sized to provide drain currents of 1.5 milliamps. FETs Q12 and Q15 provide a cascode stage such that variations in $V_{DS}$ do not appreciably affect the value of the bias current. FETs Q11, Q16, and diode D7 provide a reference voltage to bias cascode stages Q12 and Q15 and provide a first portion of the bias current. A differential pair of FETs Q9 and Q10 generates variable bias currents to FETs Q7 and Q8 in response to the ODD-/EVEN CONTROL voltage at inputs 24A and 24B. The capacitance of diodes D5 and D6, which can be used in conjunction with input resistors, filter undesirable AC signal components.

In operation, assuming the ODD/EVEN CONTROL voltage is zero, FETs Q7 and Q8 receive equal bias currents and therefore the DC offset added between the single-ended components of the BUF-CLOCK2 signal is zero. As the magnitude of the ODD-/EVEN CONTROL voltage is increased, either FET Q9 or Q10 begins to steer more of the bias current from FET 14 to either FET Q7 or Q8. The total current in FETs Q7 and Q8 remains equal to the drain offset current of FET Q14, provided through FETs Q9 and Q10, as well as the bias currents provided by FETs Q11-Q12 and Q15-Q16. As the currents in FETs Q7 and Q8 become more unbalanced, the gate-to-source voltages also become unbalanced, and an offset voltage appears between circuit nodes 32A and 32B. The output impedance of the duty cycle adjustment buffer amplifier 13 is equal to the source impedance of FETs Q7 and Q8, which is fairly low and thus capable of driving the high impedance inputs of the multiplexer 14.

Figure 6:
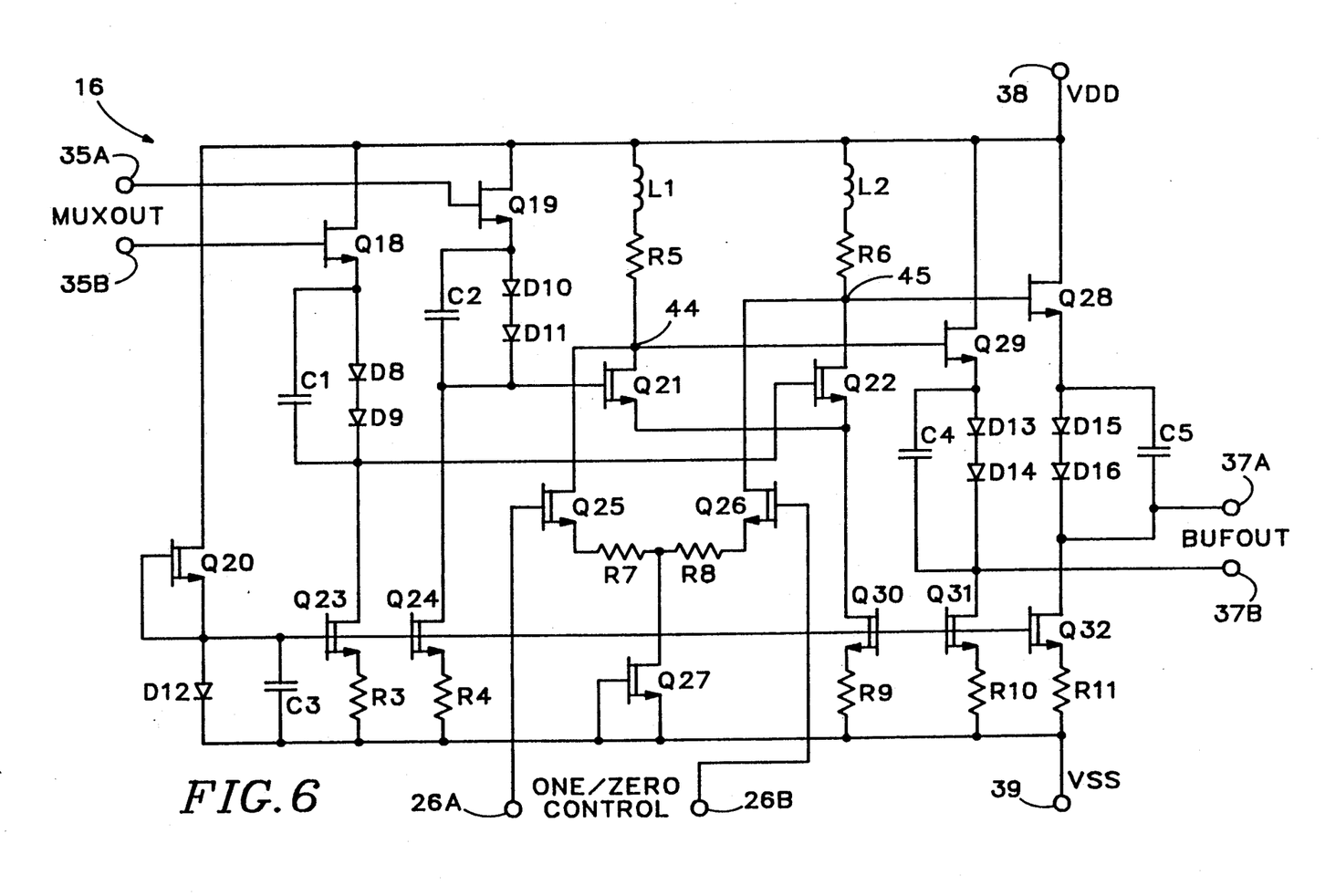
FIG. 6 is a schematic diagram of the crossing point amplitude adjustment buffer of FIG. 3.

Referring now to FIG. 6, the details of the voltage adjustment buffer amplifier 16 for adding a voltage offset to the multiplexed output signal MUXOUT are shown at the schematic level. The buffer amplifier 16 further includes a circuit for adding a variable voltage offset between the first and second single-ended components of the MUXOUT signal. The buffer amplifier 16 includes GaAs depletion FETs Q20-Q27 and Q30-Q32, as well as enhancement FETs Q18-Q19 and Q28-Q29. The balanced buffer amplifier section of buffer amplifier 16 includes a balanced FET input stage, dual level shifting circuits, a differential amplifier and load, and an output section. The balanced FET input stage includes source-follower connected enhancement FETs Q18 and Q19. The gates of FETs Q18 and Q19 form the input of buffer 16 at circuit nodes 35A and 35B. Each level shifting circuit includes two diodes D8-D9 and D10-D11 for translating the DC voltage down approximately 1.5 volts. Capacitors C1 and C2 form high-speed bypass capacitors to improve switching speed. FETs Q23-Q24 and resistors R3-R4 provide high impedance current sources for biasing the level shifting circuits. The reference voltage for FETs Q23-Q24 is provided by the combination of current-source connected FET Q20 and diode D12. Capacitor C3 filters undesirable high frequency components that may be introduced into the circuit via the power supplies VDD and VSS. A differential amplifier provides gain to the signal and includes depletion FETs Q21 and Q22. Bias current for the differential amplifier is provided by FET Q30 and resistor R9. The output voltage of the differential amplifier is developed across load resistors R5 and R6 at circuit nodes 44 and 45. Inductors L1 and L2 provide series peaking for improved switching speed. The output voltage of the differential amplifier is buffered by the balanced output stage including source-follower FETs Q28 and Q29. FETs Q18-19 and FETs Q28-29 are enhancement FETs. The voltages at the source of FETs Q28 and Q29 are level shifted with two level shifting circuits including diodes D13-D14 and capacitor C4, and diodes D15-D16 and capacitor C5. The bias current is provided by FETs Q31-Q32 and resistors R10-R11. The operation is the same as described for the level shifting circuits coupled to FETs Q18-Q19, above.

The variable voltage offset is added to the MUXOUT signal with a differential pair of FETs, which in turn generates first and second variable bias currents at circuit nodes 44 and 45 of the buffer amplifier. The differential pair of FETs includes FETs Q25 and Q26. The gates of FETs Q25 and Q26 form an input for receiving the ONE/ZERO CONTROL voltage at circuit nodes 26A and 26B. The output of the differential pair is the drain of FETs Q25 and Q26, which are coupled to the buffer amplifier 16 at circuit nodes 44 and 45. The sources of FETs Q25 and Q26 are coupled together with source degeneration resistors R7 and R8. The bias current for the differential pair is provided by current-source connected FET Q27. Typical component values are resistors R5 and R6 equal to 200 ohms, resistors R7 and R8 equal to 200 ohms, and inductors L1 and L2 equal to 2 nanohenries. At operating frequencies in the gigahertz range, the inductors L1 and L2 are spiral inductors implemented with the available integrated circuit interconnect layer. Bias currents for the buffer amplifier 16 are all in the 3 to 10 milliamp range.

In operation, assuming the ONE/ZERO CONTROL voltage is zero, FETs Q25 and Q26 receive equal bias currents and therefore the DC offset added between the single-ended components of the BUFOUT signal is zero. As the magnitude of the ONE/ZERO CONTROL voltage is increased, either FET Q25 or Q26 begins to steer more of the bias current from FET Q27 to either load resistor R5 or R6. The total current in FETs Q25 and Q26 remains equal to the drain current of FET Q27. As the currents in FETs Q25 and Q26 become more unbalanced, the voltages across load resistors R5 and R6 also become unbalanced, and an offset voltage appears between circuit nodes 37A and 37B. The gate-to-source voltage of FETs Q28 and Q29, as well as the voltage across the level shifting diodes D13-D16 remains relatively constant, and therefore most of the offset voltage appears at circuit nodes 37A and 37B. Through the proper selection of resistors R5-R8 and the current flowing through FET Q27, the ratio of control voltage to offset voltage is easily scaled. The small-signal output impedance of the voltage adjustment buffer amplifier 16 is equal to the source impedance of FETs Q28 and Q29. The low impedance and high current drive of buffer 16 is thus capable of driving the high impedance inputs of the output stage 18.

Figure 7:
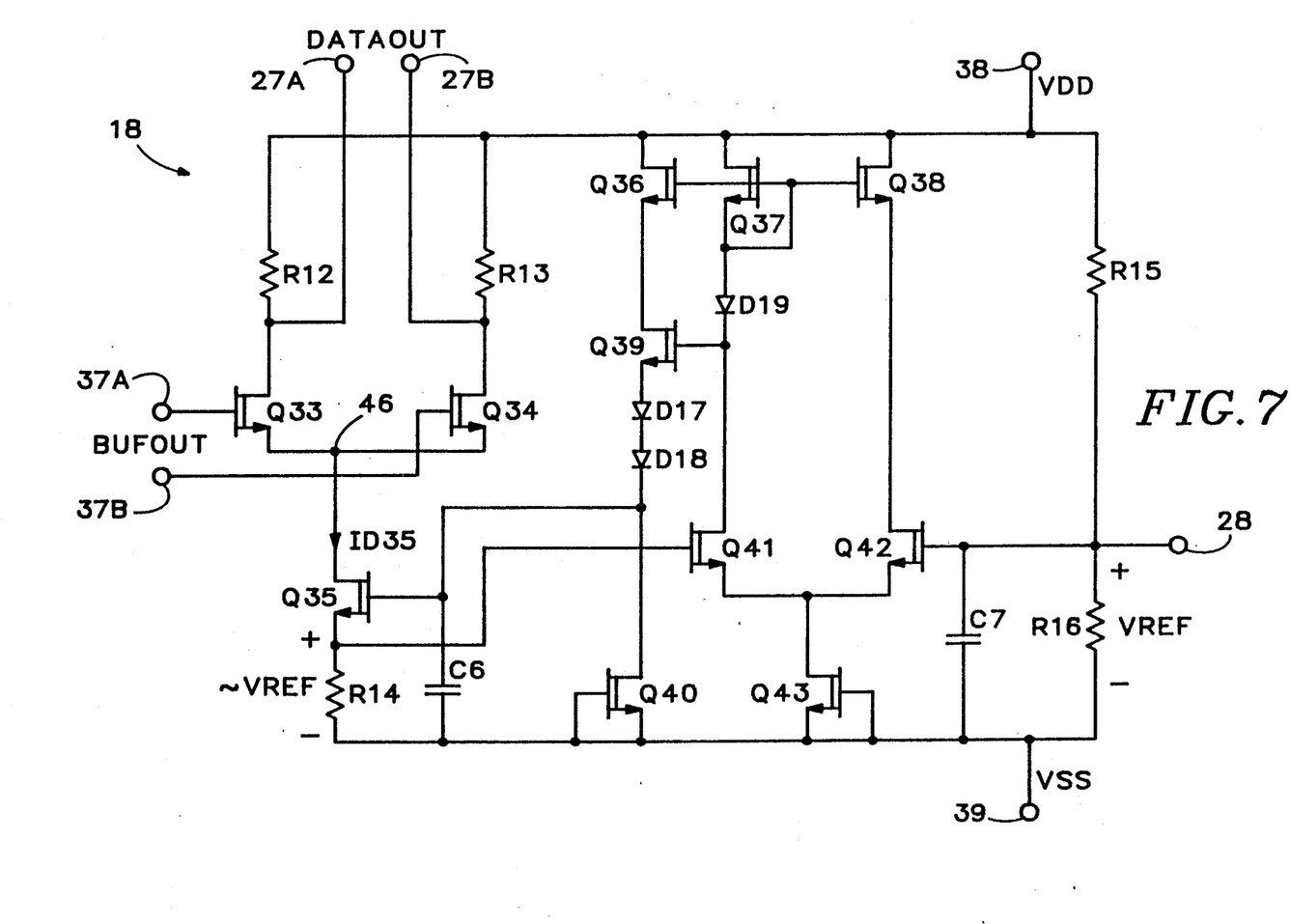
FIG. 7 is a schematic diagram of the output stage of FIG. 3.

Referring now to FIG. 7, the output stage 18 is shown at the schematic level. The output stage 18 essentially includes a differential amplifier and a precision current source. The differential amplifier receives the BUFOUT signal at circuit nodes 37A and 37B, and providing the error-corrected DATAOUT signal at circuit nodes 27A and 27B. The differential amplifier includes the differential pair of FETs Q33 and Q34 coupled at bias node 46. The DATAOUT signal is developed across load resistors R12 and R13 each equal to 50 ohms. Bias current is provided by the drain of FET Q35 designated ID35. Bias current ID35 is substantially equal to VREF divided by R14, as explained in greater detail below. The gate of bias FET Q35 is provided by a bias amplifier including the remaining circuitry in the output stage 18. A reference voltage VREF is developed at circuit node 28 by the resistor divider action of resistors R15 and R16. Resistor R15 has a value of 900 ohms and resistor R16 has a value of 300 ohms. Therefore VREF is equal to 1.25 volts when VSS is equal to −5 volts. Circuit node 28 also serves as a positive input to the bias amplifier including FETs Q36–Q43. In pertinent part, the bias amplifier includes a differential amplifier Q41–Q42, bias FET Q43, active load Q37, bootstrap FETs Q36, Q38, and output section Q39 and level shifting diodes D17–D18. The negative input to the bias amplifier is the gate of FET Q41, which is coupled to resistor R14. The output of the bias amplifier is the source of FET Q39, which provides the proper voltage to the gate of FET Q35 such that ID35 is substantially maintained at VREF/R14. Capacitors C6 and C7 are provided to filter any unwanted high frequencies components introduced through the power supplies. The precision bias current ID35 is substantially constant with respect to process and temperature variations.

Having illustrated and described the principles of my invention in a preferred embodiment thereof, it is apparent to those skilled in the art that the invention can be modified in arrangement and detail without departing from such principles. For example, the circuit blocks described above can be realized with other circuits yet provide the same function. High-speed bipolar transistors or other devices can be substituted for the GaAs FETs shown and described above. Further, component values and device sizes can be changed to better fit the requirements of a specific application. We therefore claim all modifications coming within the spirit and scope of the accompanying claims.

We claim:

1. A multiplexer system comprising:
    means for generating a variable duty cycle clock signal; a two-to-one multiplexer having first and second data inputs for respectively receiving first and second input signals, a clock input for receiving the variable duty cycle clock signal, and an output for providing a multiplexed output signal;
    means coupled to the output of the multiplexer for adjusting the amplitude of crossing points of the multiplexed signal to form an offset multiplexed output signal; and
    an output stage having an input for receiving the offset multiplexed output signal and an output for providing an error-corrected multiplexed output signal.

2. A multiplexer system as in claim 1 in which the adjusting means comprises means for adding a voltage offset to the multiplexed output signal to form the offset multiplexed output signal.

3. A multiplexer system as in claim 1 in which the variable duty cycle clock signal, the first and second input signals, the multiplexed output signal, the offset multiplexed output signal, and the error-corrected multiplexed output signal each comprises differential signals including first and second single-ended components.

4. A multiplexer system as in claim 3 in which the means for generating a variable duty cycle clock signal comprises:
    means for generating a differential system clock signal having first and second single-ended components;
    means for adding a variable voltage offset between the first and second single-ended components of the differential system clock signal.

5. A multiplexer system as in claim 4 in which the means for generating a differential system clock signal comprises a divider circuit.

6. A multiplexer system as in claim 4 in which the means for adding a variable voltage offset comprises:
    a buffer amplifier having a differential input for receiving the differential system clock signal and a differential output for providing the variable duty cycle clock signal;
    means for generating a pair of bias currents coupled to the output of the buffer amplifier; and
    means for generating first and second variable bias currents coupled to the output of the buffer amplifier.

7. A multiplexer system as in claim 6 in which the buffer amplifier comprises first and second source-follower connected FETs.

8. A multiplexer system as in claim 6 in which the means for generating first and second variable bias currents comprises a differential pair of FETs having an input for receiving a control voltage and an output coupled to the output of the buffer amplifier.

9. A multiplexer system as in claim 3 in which the two-to-one multiplexer comprises:
    a load coupled to the output;
    a first differential pair of FETs having an input forming the first data input, an output coupled to the load, and a first bias node;
    a second differential pair of FETs having an input forming the second data input, an output coupled to the load, and a second bias node; and
    a third differential pair of FETs having an input forming the clock input, an output coupled to the first and second bias nodes, and a third bias node coupled to a source of bias current.

10. A multiplexer system as in claim 3 in which the means for adding a voltage offset to the multiplexed output signal comprises means for adding a variable voltage offset between the first and second single-ended components of the multiplexed output signal.

11. A multiplexer system as in claim 10 in which the means for adding a variable voltage offset comprises:
    a buffer amplifier having a differential input for receiving the multiplexed output signal and a differential output for providing the offset multiplexed output signal; and
    means for generating first and second variable bias currents coupled to the output of the buffer amplifier.

12. A multiplexer system as in claim 11 in which the buffer amplifier comprises:
- an FET input stage having an input forming the differential input of the buffer amplifier and an output;
- a differential amplifier having an input coupled to the output of the FET input stage and an output forming the differential output of the buffer amplifier; and
- a load coupled to the output of the differential amplifier.

13. A multiplexer system as in claim 11 in which the means for generating first and second variable bias currents comprises a differential pair of FETs having an input for receiving a control voltage and an output coupled to the output of the buffer amplifier.

14. A multiplexer system as in claim 3 in which the output stage comprises:
- a differential amplifier having an input for receiving the offset multiplexed output signal, an output for providing the error-corrected output signal, and a bias node;
- means coupled to the bias node for generating a precision bias current that is substantially constant with respect to process and temperature variations.

15. A multiplexer system as in claim 2 further comprising a $2^N$-to-two multiplexer having N input channels, wherein N is an integer greater than one, for generating the first and second input signals.

16. A method for improving the bit error rate of multiplexed input signals, the method comprising the steps of:
- multiplexing first and second input signals to form a multiplexed output signal, wherein the multiplexed output signal contains alternating portions of the first and second input signals in response to the polarity of a clock signal;
- varying the duty cycle of the clock signal; and
- adjusting the amplitude of crossing points of the multiplexed output signal.

17. The method of claim 16 in which the step of adjusting the amplitude comprises adding a voltage offset to the multiplexed output signal.

18. The method of claim 16 in which the step of multiplexing comprises multiplexing the first and second input signals in response to a differential clock signal having first and second single-ended components.

19. The method of claim 18 in which the step of varying the duty cycle of the clock signal comprises adding an offset voltage between the first and second single-ended components of the differential clock signal.

20. A method for improving the bit error rate of multiplexed input signals, the method comprising the steps of:
- multiplexing first and second differential input signals to form a differential multiplexed output signal, wherein the multiplexed output signal contains alternating portions of the first and second input signals in response to the polarity of a clock signal;
- varying the duty cycle of the clock signal to control the transition between the alternating portions of the multiplexed output signal with respect to time; and
- independently controlling the amplitude of the crossing points between one/zero and zero/one transitions of the multiplexed output signal.

21. The method of claim 20 in which the step of independently controlling the amplitude comprises adding a voltage offset between first and second single-ended components of the multiplexed output signal.

22. The method of claim 20 in which the step of multiplexing comprises multiplexing the first and second input signals in response to a differential clock signal having first and second single-ended components and the step of varying the duty cycle of the clock signal comprises adding an offset voltage between the first and second single-ended components of the differential clock signal.

23. The method of claim 20 further comprising the final step of buffering and normalizing logic levels of the multiplexed output signal.

* * * * *

UNITED STATES PATENT AND TRADEMARK OFFICE
CERTIFICATE OF CORRECTION

PATENT NO.    :   5,182,467
DATED         :   January 26, 1993
INVENTOR(S)   :   Taylor et al.

It is certified that error appears in the above-identified patent and that said Letters Patent is hereby corrected as shown below:

Column 9, line 61, claim 1, after "multiplexed" insert --output--.

Signed and Sealed this

Twenty-third Day of November, 1993

*Attest:*

BRUCE LEHMAN

*Attesting Officer*  *Commissioner of Patents and Trademarks*